(12) United States Patent
Payer et al.

(10) Patent No.: US 10,890,622 B2
(45) Date of Patent: Jan. 12, 2021

(54) INTEGRATED CIRCUIT CONTROL LATCH PROTECTION

(71) Applicant: International Business Machines Corporation, Armonk, NY (US)

(72) Inventors: Stefan Payer, Stuttgart (DE); Michael Klein, Schoenaich (DE); Nicol Hofmann, Leinfelden-Echterdingen (DE); Cedric Lichtenau, Stuttgart (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/397,107

(22) Filed: Apr. 29, 2019

(65) Prior Publication Data

US 2020/0341839 A1 Oct. 29, 2020

(51) Int. Cl.
*G01R 31/3185* (2006.01)
*G06F 11/10* (2006.01)
*G06F 30/327* (2020.01)

(52) U.S. Cl.
CPC .. *G01R 31/318525* (2013.01); *G06F 11/1032* (2013.01); *G06F 11/1076* (2013.01); *G06F 30/327* (2020.01)

(58) Field of Classification Search
CPC ............... H03K 3/0375; G01R 31/318525
USPC ................................................. 714/735, 824
See application file for complete search history.

(56) References Cited

U.S. PATENT DOCUMENTS

| 6,487,704 | B1 * | 11/2002 | McNamara | G06F 11/263 716/106 |
| 7,937,679 | B2 * | 5/2011 | Mariani | G06F 30/33 716/104 |
| 8,560,932 | B2 * | 10/2013 | Kleihorst | G01R 31/3193 714/736 |
| 9,231,591 | B1 * | 1/2016 | Lesea | G06F 1/28 |
| 9,444,496 | B2 | 9/2016 | Manoochehri et al. | |
| 9,600,616 | B1 | 3/2017 | Arbel et al. | |
| 9,639,418 | B2 * | 5/2017 | Bowman | G06F 11/102 |
| 10,277,213 | B1 * | 4/2019 | Kimelman | H03K 5/1252 |
| 10,496,471 | B2 * | 12/2019 | Barrilado Gonzalez | G06F 3/064 |
| 2003/0093773 | A1 * | 5/2003 | Reed | G06F 30/33 717/135 |
| 2005/0073345 | A1 * | 4/2005 | Schneider | G06F 11/1008 327/185 |
| 2006/0220716 | A1 * | 10/2006 | Nicolaidis | H03K 3/013 327/199 |
| 2007/0033514 | A1 * | 2/2007 | Ogawa | G06F 11/1032 714/801 |

(Continued)

*Primary Examiner* — Steven N Nguyen
(74) *Attorney, Agent, or Firm* — Cantor Colburn LLP; Margaret McNamara

(57) ABSTRACT

Aspects include parsing, by a computer system, a design file of an integrated circuit including a plurality of stages to extract a plurality of inputs and outputs of a plurality of latches. The computer system can sort the latches based on latch locations in the stages and build a plurality of ordered vectors of signals before and after the latches based on the sorting. The computer system can build a plurality of parity vectors for each of the ordered vectors of signals before and after the latches, build a latch bank for each of the parity vectors before the latches, and build a parity vector comparison to detect a parity failure based on comparing the parity vectors after the latches with an output of the latch bank.

20 Claims, 6 Drawing Sheets

(56) References Cited

U.S. PATENT DOCUMENTS

| | | | |
|---|---|---|---|
| 2010/0153824 A1* | 6/2010 | Pribbernow | G06F 11/1008 714/780 |
| 2010/0244918 A1* | 9/2010 | Moyer | H03K 19/0075 327/208 |
| 2013/0169360 A1* | 7/2013 | Gupta | H03K 3/356156 330/253 |
| 2013/0268906 A1 | 10/2013 | Arbel et al. | |
| 2015/0121132 A1* | 4/2015 | Tian | G06F 9/30141 714/6.24 |
| 2015/0171840 A1* | 6/2015 | Sano | H03K 3/356156 327/198 |
| 2016/0117217 A1* | 4/2016 | Anand | G06F 11/1004 714/57 |
| 2016/0378599 A1 | 12/2016 | Schmit et al. | |

\* cited by examiner

```
f0_ctl_ras_parity_before_latch_p(0 to 7) <=
   pgen(f0_ctl_ras_parity_before_latch(0 to 125), 16);

f1_ctl_ras_parity_after_latch_p(0 to 7) <=
   pgen(f0_ctl_ras_parity_after_latch(0 to 125), 16);
```

INTEGRATED CIRCUIT CONTROL LATCH PROTECTION

BACKGROUND

The present invention relates to computer systems, and more particularly, to control latch protection in an integrated circuit.

Processing systems, including processors and memory systems, may make use of multiple types of error checking, correction and reporting mechanisms to improve recoverability, availability, and serviceability (RAS) and data integrity. In higher-end systems, such as mainframes, it is typical for data to be checked, corrected and reported upon in many places within write and read paths. Higher speed and higher density integrated circuit technologies can increase susceptibility to single event upset events, such as a change in the state of a latch within a signal path, for instance, due to alpha particles or other such phenomena. Data buses and address buses are typically multiple bits wide, e.g., eight or more bits grouped together, which enables protection mechanisms to act upon groups of bits in parallel.

Control logic within an integrated circuit, such as a processor, can also include latches for temporary storage and timing purposes. However, the latches in control logic of integrated circuits are typically single-bit latches and operate independently from each other. The separate operation of control logic latches makes it challenging to provide a protection mechanism and may result in substantial overhead if protection is provided on a functional basis.

SUMMARY

According to one or more embodiments of the present invention, a computer-implemented method includes parsing, by a computer system, a design file of an integrated circuit including a plurality of stages to extract a plurality of inputs and outputs of a plurality of latches. The computer system can sort the latches based on latch locations in the stages and build a plurality of ordered vectors of signals before and after the latches based on the sorting. The computer system can build a plurality of parity vectors for each of the ordered vectors of signals before and after the latches, build a latch bank for each of the parity vectors before the latches, and build a parity vector comparison to detect a parity failure based on comparing the parity vectors after the latches with an output of the latch bank.

Other embodiments of the invention implement the features of the above-described method in a system and in a computer program product.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
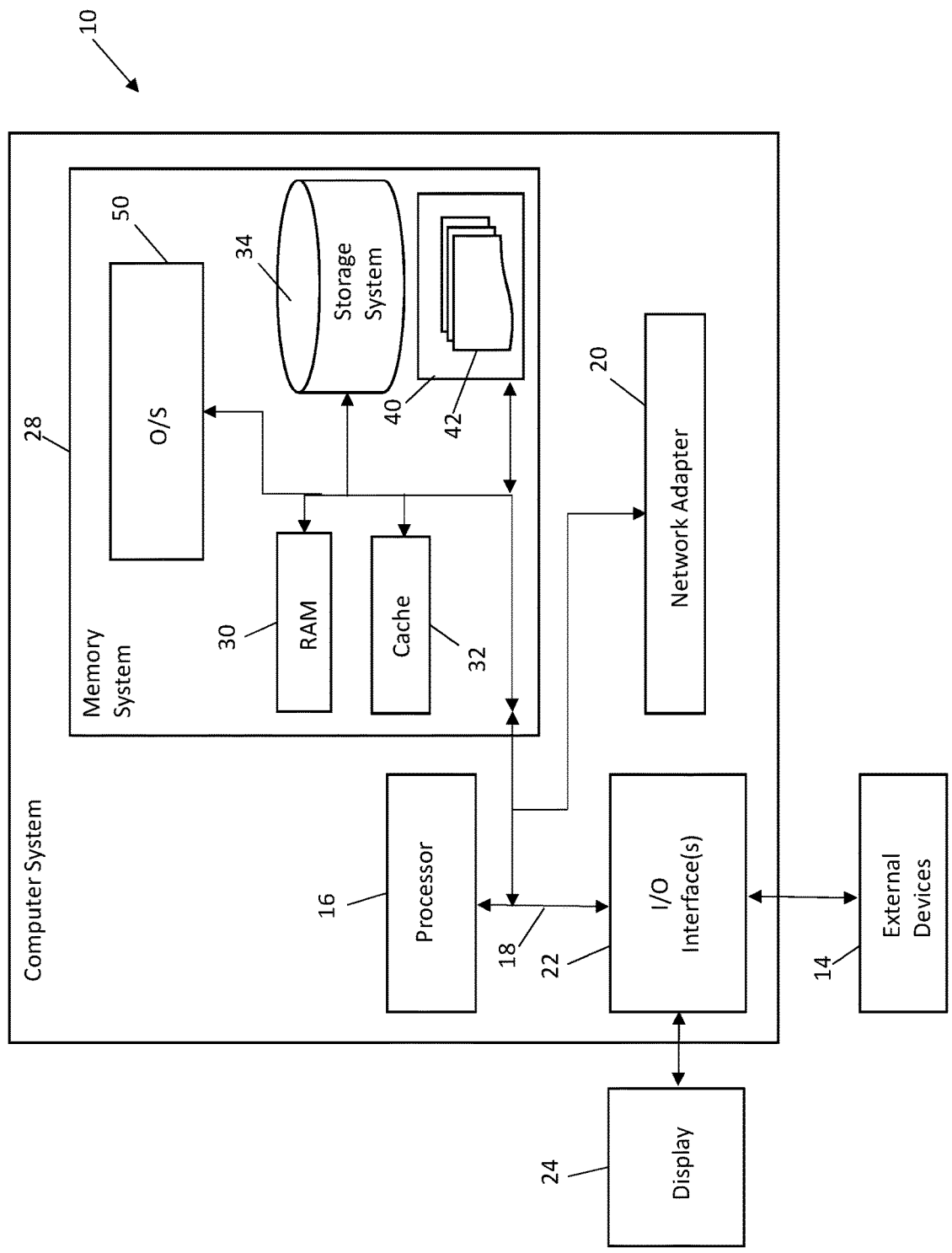
FIG. 1 is a block diagram illustrating a computer system in accordance with various embodiments of the invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can include any integer number greater than or equal to one, i.e. one, two, three, four, etc. The terms "a plurality" can include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, latches in control logic of an integrated circuit design are typically distributed as many independent single bits. The latches may be added to the integrated circuit design for timing and signal integrity purposes. Attempting to identify control logic latches can be a difficult task due to the distribution of control logic throughout the integrated circuit design. Similar to other storage elements within the integrated circuit design, control logic latches are susceptible to single-event upsets. A "bundle check" may be used to test a bundle of control signals at the input of a control multiplexer for path selection; however, such control signal checking is limited.

Turning now to an overview of the aspects of the invention, one or more embodiments of the invention address the above-described shortcomings of the prior art by concatenating control latch input bits into an artificial vector (e.g., an ordered vector of signals) and protecting the vector with parity. A design tool, such as a script-based application, can execute on a computer system of an integrated circuit design system to perform tree traversal parsing, sorting, and ordering of control bits (to be protected) according to pipe-stage location plus time-domain (before/after a latch) during synthesis. A parity vector (e.g., check for a bundle of control bits) can be parametrized regarding bit width. The protection mechanism can be extended from simple parity checks to other checking mechanisms, such as error correction codes, and the like.

The above-described aspects of the invention address the shortcomings of the prior art by adding test logic circuitry to a design of an electronic circuit in order to improve its protection against malfunctions caused, for example, by alpha particles. The design can be provided in the form of a hardware design language description using unique naming conventions for the latches. Alternatively, other types of design files can be parsed to identify control latches, such as netlist files, clock buffer usage files, and/or other sources of design data. Technical effects and benefits can include adding protection to control latches in an integrated circuit design.

With reference now to FIG. 1, a computer system 10 is illustrated in accordance with a non-limiting embodiment of the present disclosure. The computer system 10 may be based on the IBM Z architecture or POWER architecture, for example, offered by International Business Machines Corporation (IBM). The architecture, however, is only one example of the computer system 10 and is not intended to suggest any limitation as to the scope of use or functionality of embodiments described herein. Regardless, computer system 10 is capable of being implemented and/or performing any of the functionality set forth hereinabove.

Computer system 10 is operational with numerous other computing system environments or configurations. Examples of well-known computing systems, environments, and/or configurations that may be suitable for use with computer system 10 include, but are not limited to, personal computer systems, server computer systems, thin clients, thick clients, cellular telephones, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. Further, elements of the computer system 10 can be incorporated in one or more network devices to support computer network functionality, such as a network switch, a network router, or other such network support devices.

Computer system 10 may be described in the general context of computer system-executable instructions, such as program modules, being executed by the computer system 10. Generally, program modules may include routines, programs, objects, components, logic, data structures, and so on that perform particular tasks or implement particular abstract data types. Computer system 10 may be practiced in distributed cloud computing environments where tasks are performed by remote processing devices that are linked through a communications network. In a distributed computing environment, program modules may be located in both local and remote computer system storage media including memory storage devices.

As shown in FIG. 1, computer system 10 is shown in the form of a computing device, also referred to as a processing device. The components of computer system may include, but are not limited to, a processor 16 including one or more processing cores or processing units, a memory system 28, and a bus 18 that operably couples various system components including memory system 28 to processor 16.

Bus 18 represents one or more of any of several types of bus structures, including a memory bus or memory control, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 10 may include a variety of computer system readable media. Such media may be any available media that are accessible by computer system/server 10, and they include both volatile and non-volatile media, removable and non-removable media.

Memory system 28 can include an operating system (OS) 50, along with computer system readable media in the form of volatile memory, such as random access memory (RAM) 30 and/or cache memory 32. Computer system 10 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory system 28 may include at least one program product having a set (e.g., at least one) of program modules that are configured to carry out the functions of embodiments of the disclosure.

The OS 50 controls the execution of other computer programs and provides scheduling, input-output control, file and data management, memory management, and communication control and related services. The OS 50 can also include communication protocol support as one or more drivers to implement various protocol layers in a protocol stack (e.g., transmission control protocol/internet protocol (TCP/IP)) to support communication with other computer systems across one or more computer networks.

The storage system 34 can store a basic input output system (BIOS). The BIOS is a set of essential routines that initialize and test hardware at startup, start execution of the OS 50, and support the transfer of data among the hardware devices. When the computer system 10 is in operation, the processor 16 is configured to execute instructions stored within the storage system 34, to communicate data to and from the memory system 28, and to generally control operations of the computer system 10 pursuant to the instructions.

Program/utility 40, having a set (at least one) of program modules 42, may be stored in memory system 28 by way of example, and not limitation, as well as the OS 50, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein at an application layer level in a communication protocol stack.

Computer system 10 may also communicate with one or more external devices 14 such as a keyboard, a pointing device, a display 24, etc.; one or more devices that enable a user to interact with computer system/server 10; and/or any devices (e.g., network card, modem, etc.) that enable computer system/server 10 to communicate with one or more other computing devices. Such communication can occur via Input/Output (I/O) interfaces 22. Still yet, computer system 10 can communicate with one or more networks such as a local area network (LAN), a general wide area network (WAN), and/or a public network (e.g., the Internet) via network adapter 20. As depicted, network adapter 20 communicates with the other components of computer system 10 via bus 18. It should be understood that although not shown, other hardware and/or software components could be used in conjunction with computer system 10. Examples include, but are not limited to: microcode, device drivers, redundant processing units, external disk drive arrays, RAID systems, tape drives, data archival storage systems, etc.

Figure 2:
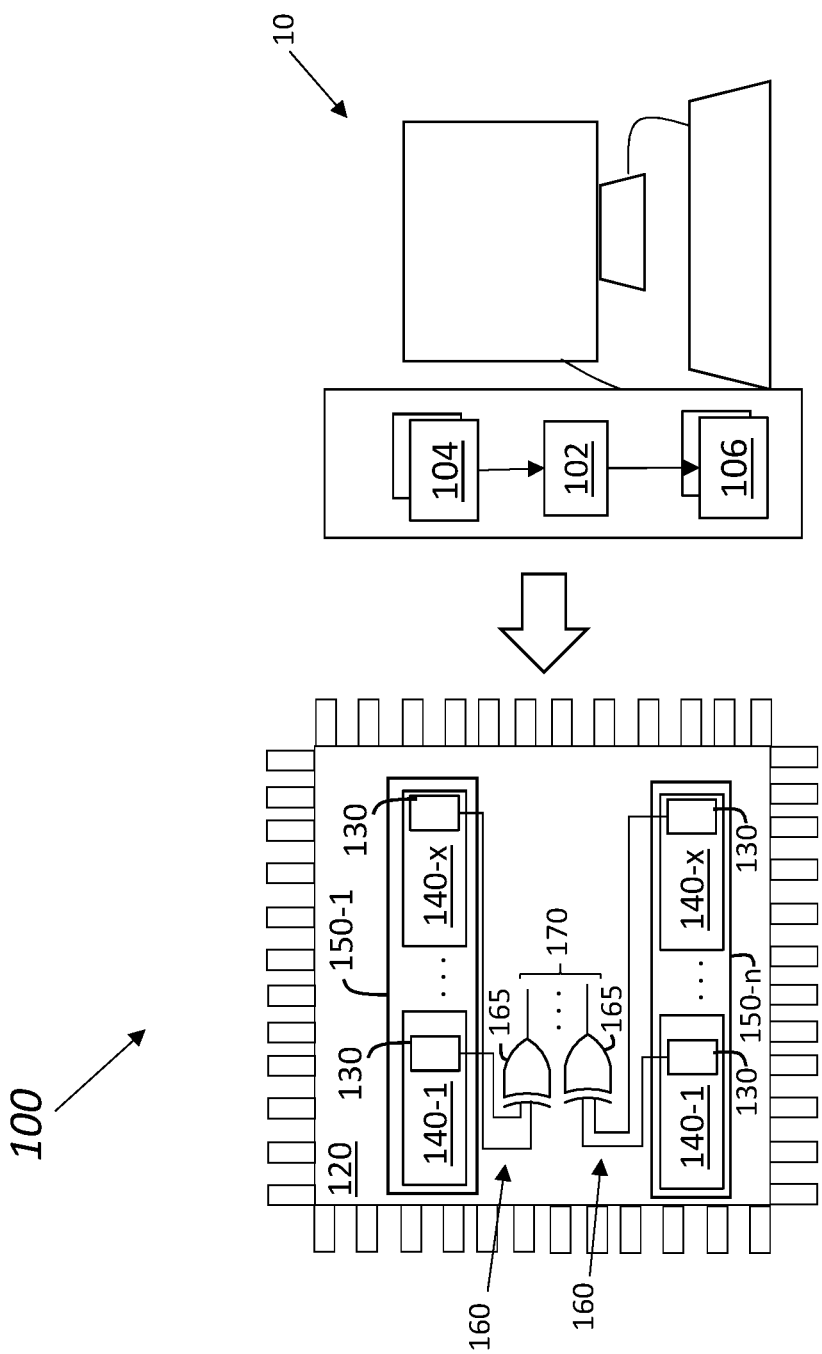
FIG. 2 is a block diagram of an integrated circuit development system according to a non-limiting embodiment.

Turning now to a more detailed description of aspects of the present invention, FIG. 2 depicts a block diagram of an integrated circuit development system 100 (also referred to as system 100) to add control latch protection an integrated circuit design according to one or more embodiments of the invention. The system 100 includes the computer system 10 of FIG. 1 with an integrated circuit design tool 102 that can be used to generate or modify one or more design files 104 that are ultimately fabricated into an integrated circuit 120. The steps involved in the fabrication of the integrated circuit 120 are well-known and only briefly described herein and with reference to FIG. 7. The physical layout is finalized, in part, based on chip-level timing and placement analysis for buffer-bay placement according to embodiments of the invention. The finalized physical layout may be provided to a foundry or other manufacturing facility. Masks can be generated for each layer of the integrated circuit 120 based on the finalized physical layout. Then, the wafer is processed in the sequence of the mask order. The processing includes photolithography and etch. The fabrication is further discussed with reference to FIG. 7.

The integrated circuit design tool 102 is configured to read one or more design files 104 of the integrated circuit 120 and perform methods further described herein to produce one or more modified design files 106 that support fabrication of the integrated circuit 120. The one or more design files 104 can be stored in a hardware description language, such as Very High Speed Integrated Circuit (VHSIC) Hardware Description Language (VHDL) to support electronic design automation and fabrication of the integrated circuit 120. A VHDL compiler or other support tools can generate hardware out of the one or more design files 104. The example design of the integrated circuit 120 can include multiple stages 150-1 to 150-$n$ (generally, stages 150), which can be processor pipeline stages associated with a functional unit of a processor, such as a floating-point unit. The stages 150 can include various control blocks 140-1 to 140-$x$ (generally, control blocks 140). The control blocks 140 can include one or more latches 130 that may be single-bit latches to support control functions and/or timing constraints within each of the stages 150. The latches 130 can be sorted and grouped, for example, based on latch locations in the stages 150 into ordered vectors of signals 160. The ordered vectors of signals 160 can be generated based on identifying signals before and after the latches 130. Parity vectors 170 can be generated for the ordered vectors of signals 160. The parity vectors 170 can be generated, for example, by applying an exclusive-or logical function 165 to a plurality of bits in the ordered vectors of signals 160. By comparing parity vectors 170 of inputs and outputs of the latches 130, it can be determined whether one of the latches 130 had a bit flip (e.g., an unexpected state change) during an observation period.

Figure 3:
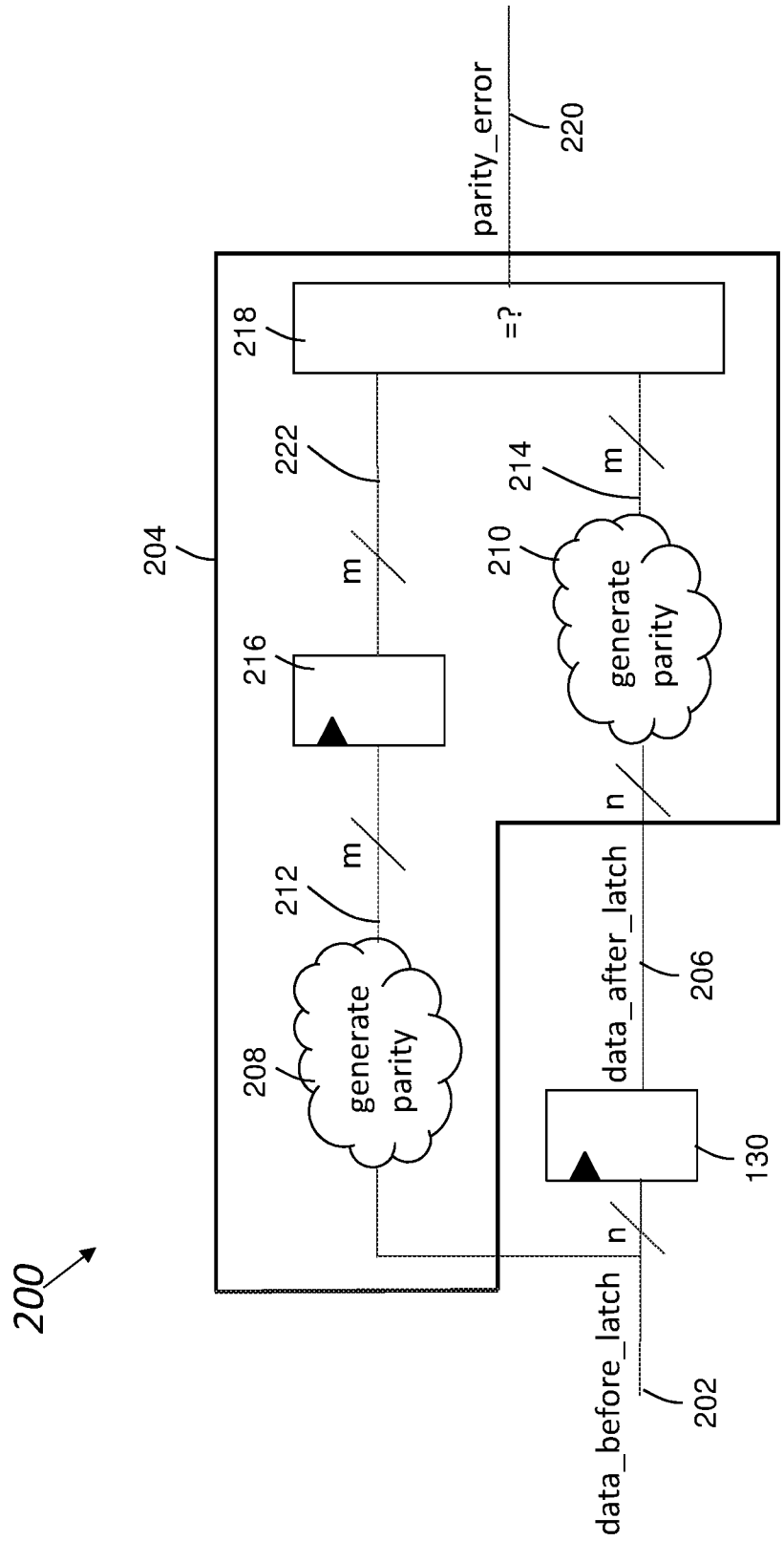
FIG. 3 is a block diagram of control latch protection logic according to a non-limiting embodiment.

FIG. 3 is a block diagram of control latch protection logic 200 that can be applied to add protection for one or more of the latches 130 in control logic of the integrated circuit 120 of FIG. 1. Input 202 to a latch 130 can be a multiple bit input (n-bits) or a single-bit input. Protection logic 204 can be added by the integrated circuit design tool 102 to check for a change in parity of the input 202 to an output 206 of the latch 130. In the example of FIG. 3, the protection logic 204 includes parity generation 208 on the input 202 and parity generation 210 on the output 206 of latch 130. The parity generation 208 and 210 can result in a different number of bits (e.g., m-bits, a reduced number) than are included in the input 202 and output 206. For example, eight bits in latch 130 may be summarized as a single parity bit using the exclusive-or logical function 165 of FIG. 2. A parity vector 212 can be output from the parity generation 208, and a parity vector 214 can be output from the parity generation 210. The parity vector 212 can be provided to a latch bank 216 to hold for comparison with the parity vector 214 at a parity vector comparison 218. The parity vector comparison 218 can detect a parity failure based on comparing the parity vector 214 after the latch 130 with an output 222 of the latch bank 216, where the result of the parity vector comparison 218 is output as a parity error indicator 220. A mismatch at the parity vector comparison 218 indicates that an error, such as an unexpected bit flip occurred. The protection logic 204 can be expanded to combine inputs 202 and outputs 206 of multiple latches 130 spread across various control blocks 140 and stages 150 of FIG. 2.

Figures 4, 5:
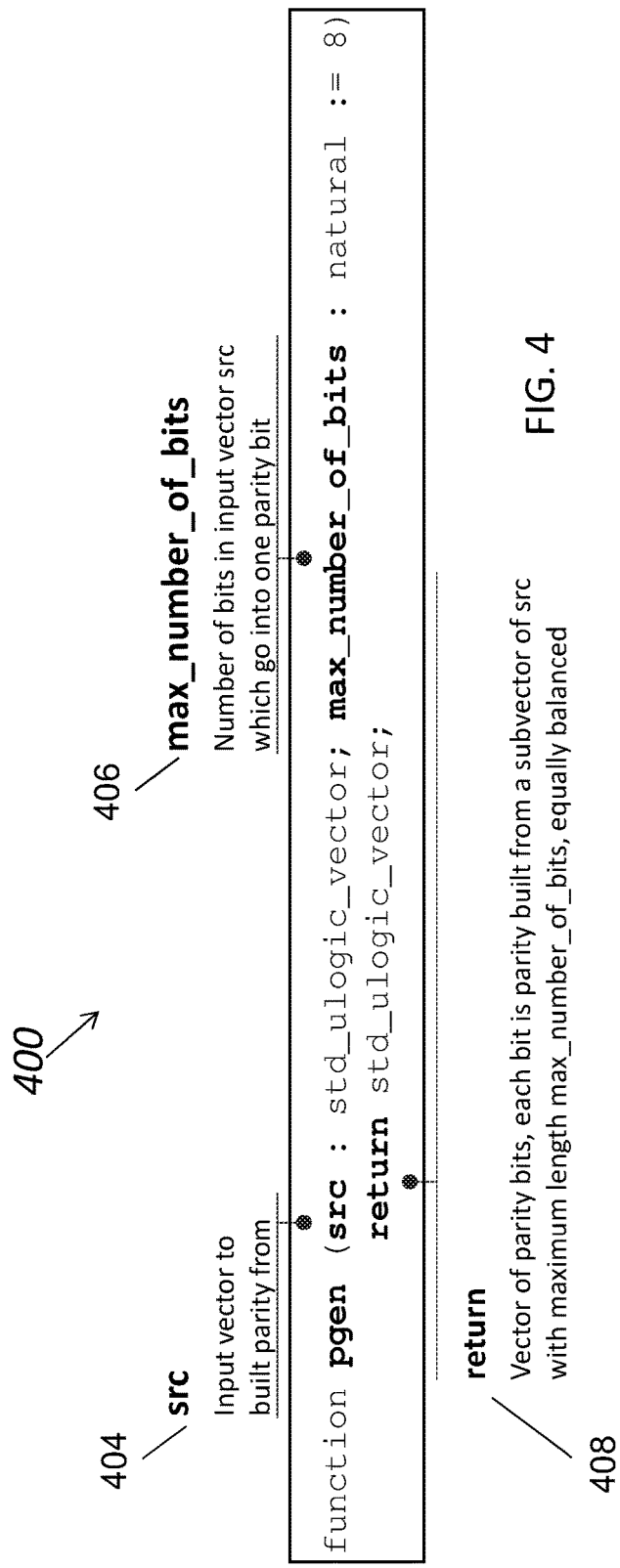
FIG. 4 is a block diagram of a parity generation function format according to a non-limiting embodiment.
FIG. 5 is a block diagram of a parity generation function applied before and after a control latch vector according to a non-limiting embodiment.

FIG. 4 is a block diagram of a parity generation function format 400 that can be used by the parity generation 208, 210 of FIG. 3. The parity generation function format 400 can be expressed in a hardware description language format for insertion into the design files 104 as modified design files 106 by the integrated circuit design tool 102. In the example of FIG. 4, the parity generation function format 400 specifies a source 404 as an input vector to build parity from, such as ordered vectors of signals 160 before and after the latches 130 of FIG. 2. The parity generation function format 400 can also specify a maximum number of bits 406 per parity tree as a first parameter constraining generation of the parity vectors 170 of FIG. 2. The maximum number of bits 406 can be a number of bits in the input vector defined in the source 404 that go into one parity bit (e.g., a value of eight would XOR eight bits of sources 404 per parity bit). The parity generation function format 400 can also specify a return format 408 as a vector of parity bits, where each bit is parity built from a sub-vector of source 404 with a maximum length of the maximum number of bits 406, equally balanced.

FIG. 5 is a block diagram 500 of a parity generation function applied before and after a control latch vector. Using the parity generation function format 400 of FIG. 4, a signal vector can be formed to condense 126-bits before one or more latches 130 down to eight bits of parity before and after the one or more latches 130. The example grouping of 126-bits can be from ordered vectors formed from latches 130 sorted and grouped from the same stages 150.

Figure 6:
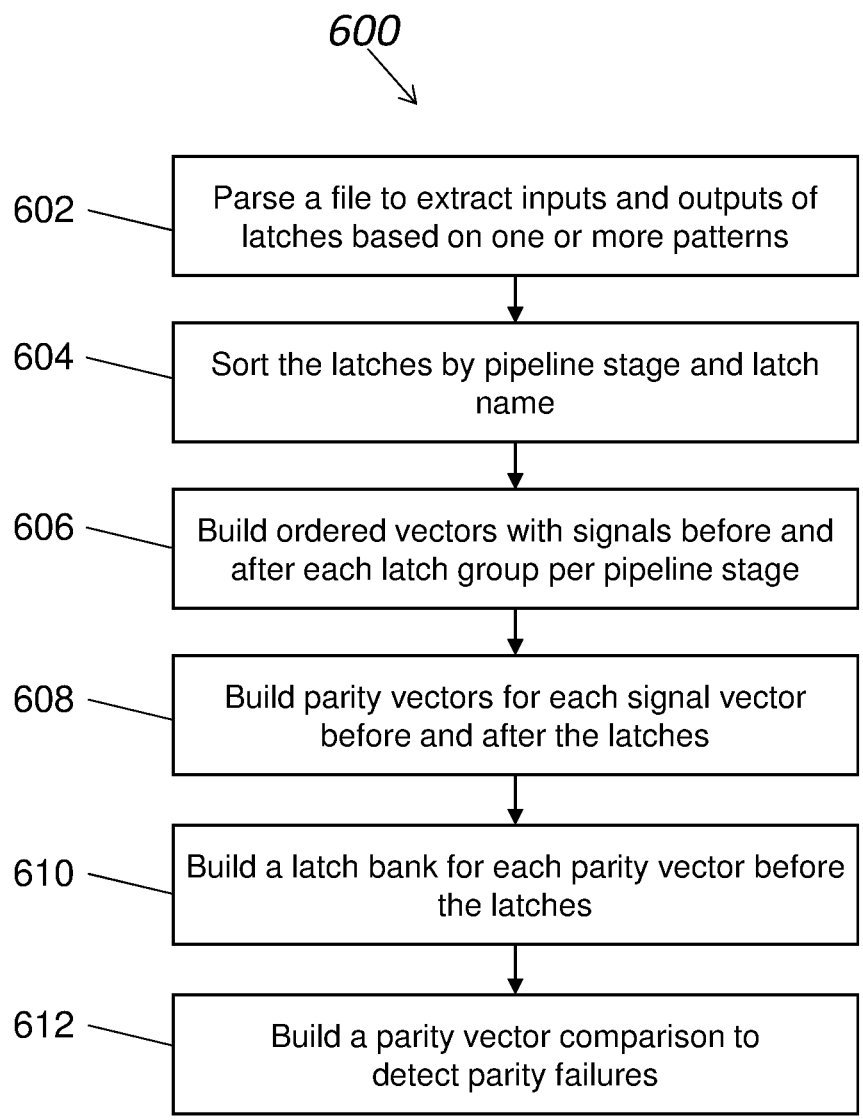
FIG. 6 is a flow diagram illustrating a method according to a non-limiting embodiment.

Turning now to FIG. 6, a flow diagram of a process 600 is generally shown in accordance with an embodiment. The process 600 is described with reference to FIGS. 1-6 and may include additional steps beyond those depicted in FIG. 6. The process 600 can be performed by the computer system 10 of FIGS. 1 and 2 as a computer-implemented method, and more specifically by the integrated circuit design tool 102 executing on the processor 16 of FIG. 1 and accessing design files 104 and 106 in memory system 28. In the process 600, "build" or "building" can include creation of design elements through behavioral or structural representations (e.g., models or code) specifying the interconnection of components that may be compiled into a hardware form.

At block 602, the computer system 10 parses a design file 104 of an integrated circuit 120 including a plurality of stages 150 to extract a plurality of inputs 202 and outputs 206 of a plurality of latches 130. The parsing can be based on one or more patterns detected in the design file 104. The one or more patterns can include a naming convention (e.g., f0_somename_in for pipeline stage0 latch input and f0_somename_q for pipeline stage0 latch output) applied to the inputs 202 and outputs 206 of the latches 130, where the naming convention identifies the stages 150. Further, the one or more patterns can be extracted from a variety of data sources and file types, such as one or more of: an instantiation pattern, content of a netlist, clock buffer usage, and/or other sources.

At block 604, the computer system 10 can sort the latches 130 based on latch locations in the stages 150. Sorting can be performed, for instance, by stages 150 of a pipeline, by latch name, and/or by other criteria.

At block 606, the computer system 10 can build a plurality of ordered vectors of signals 160 before and after the latches 130 based on the sorting. For example, grouping of latches 130 can result in ordered vectors of inputs and outputs aggregated across control blocks 140 of a same stage 150.

At block 608, the computer system 10 can build plurality of parity vectors 170 for each of the ordered vectors of signals 160 before and after the latches 130. Generation of the parity vectors 170 can be constrained based on a first parameter that defines a maximum number of bits per parity tree. The first parameter can define a logic depth and how many bit failures can be detected. Further, generation of the parity vectors 170 can be based on a second parameter that defines an amount of bits to be protected. The second parameter may be used where not every bit needs to be protected, but a ratio or percentage of the bits may be protected out of the total bits in the design of the integrated circuit 120. The parity vectors 170 can apply an exclusive-or logical function 165 to a plurality of bits in the ordered vectors of signals 160.

At block 610, the computer system 10 can build a latch bank 216 for each of the parity vectors 212 before the latches 130. At block 612, the computer system 10 can build a parity vector comparison 218 to detect a parity failure based on comparing the parity vectors 214 after the latches 130 with an output 222 of the latch bank 216. The parity vector comparison 218 can be generated based on determining that the stages 150 are active, for instance, by using a logical AND gate with a validity or activity signal to avoid fault detection on inactive circuitry. The integrated circuit 120 including the latches 130, the parity vectors 170, the latch bank 216, and the parity vector comparison 218 can be fabricated, or fabrication can be initiated, for instance, through the process further described in reference to FIG. 7. The design files 104 updated by the integrated circuit design tool 102 as modified design files 106 can be used to support the fabrication of the integrated circuit 120 using the process of FIG. 7 or other processes known in the art.

Figure 7:
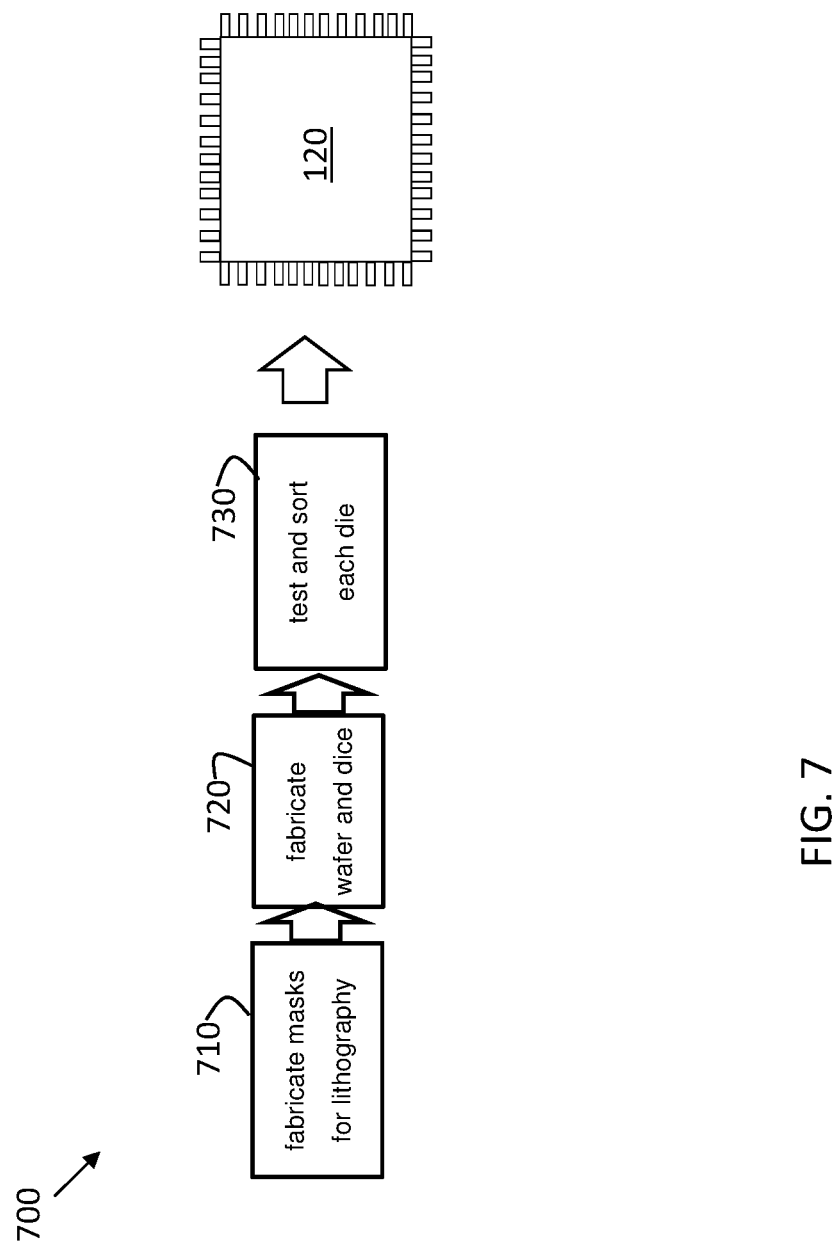
FIG. 7 is a flow diagram illustrating a method according to a non-limiting embodiment.

FIG. 7 is a process flow 700 of a method of fabricating the integrated circuit 120 designed according to one or more embodiments of the invention. Once the physical design data is obtained, based, in part, on performing the process 600 of FIG. 6 according to one or more embodiments of the invention, the processes shown in FIG. 7 can be performed to fabricate the integrated circuit 120. Generally, a wafer with multiple copies of the final design is fabricated and cut (i.e., diced) such that each die is one copy of the integrated circuit 120. At block 710, the processes include fabricating masks for lithography based on the finalized physical layout. At block 720, fabricating the wafer includes using the masks to perform photolithography and etching. Once the wafer is diced, testing and sorting each die is performed, at block 730, to filter out any faulty die.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
   parsing, by a computer system, a design file of an integrated circuit comprising a plurality of stages to extract a plurality of inputs and outputs of a plurality of latches;
   sorting, by the computer system, the latches based on latch locations in the stages;

building, by the computer system, a plurality of ordered vectors of signals before and after the latches based on the sorting;

building, by the computer system, a plurality of parity vectors for each of the ordered vectors of signals before and after the latches, the building of the parity vectors constrained based on a first parameter that defines a maximum number of bits per parity tree;

building, by the computer system, a latch bank for each of the parity vectors before the latches;

building, by the computer system, a parity vector comparison to detect a parity failure based on comparing the parity vectors after the latches with an output of the latch bank; and updating the design file to fabricate the integrated circuit comprising the latches, the parity vectors, the latch bank, and the parity vector comparison.

2. The computer-implemented method of claim 1, wherein the parsing is based on one or more patterns detected in the design file.

3. The computer-implemented method of claim 2, wherein the one or more patterns comprise a naming convention applied to the inputs and outputs of the latches, wherein the naming convention identifies the stages.

4. The computer-implemented method of claim 2, wherein the one or more patterns comprise one or more of: an instantiation pattern, content of a netlist, and clock buffer usage.

5. The computer-implemented method of claim 1, further comprising:
constraining generation of the parity vectors based on a second parameter that defines an amount of bits to be protected.

6. The computer-implemented method of claim 1, wherein the parity vectors apply an exclusive-or logical function to a plurality of bits in the ordered vectors of signals, and the parity vector comparison is generated based on determining that the stages are active.

7. The computer-implemented method of claim 1, further comprising:
fabricating the integrated circuit comprising the latches, the parity vectors, the latch bank, and the parity vector comparison.

8. A system comprising:
a memory system configured to store a design file of an integrated circuit comprising a plurality of stages; and
a processor configured to perform a plurality of operations comprising:
parsing the design file to extract a plurality of inputs and outputs of a plurality of latches;
sorting the latches based on latch locations in the stages;
building a plurality of ordered vectors of signals before and after the latches based on the sorting;
building a plurality of parity vectors for each of the ordered vectors of signals before and after the latches, the building of the parity vectors constrained based on a first parameter that defines a maximum number of bits per parity tree;
building a latch bank for each of the parity vectors before the latches;
building a parity vector comparison to detect a parity failure based on comparing the parity vectors after the latches with an output of the latch bank; and
updating the design file to fabricate the integrated circuit comprising the latches, the parity vectors, the latch bank, and the parity vector comparison.

9. The system of claim 8, wherein the parsing is based on one or more patterns detected in the design file.

10. The system of claim 9, wherein the one or more patterns comprise a naming convention applied to the inputs and outputs of the latches, wherein the naming convention identifies the stages.

11. The system of claim 9, wherein the one or more patterns comprise one or more of: an instantiation pattern, content of a netlist, and clock buffer usage.

12. The system of claim 8, wherein the processor is configured to perform operations comprising:
constraining generation of the parity vectors based on a second parameter that defines an amount of bits to be protected.

13. The system of claim 8, wherein the parity vectors apply an exclusive-or logical function to a plurality of bits in the ordered vectors of signals, and the parity vector comparison is generated based on determining that the stages are active.

14. The system of claim 8, wherein the system is configured to initiate fabrication of the integrated circuit comprising the latches, the parity vectors, the latch bank, and the parity vector comparison.

15. A computer program product comprising a computer readable storage medium having program instructions embodied therewith, the program instructions executable by a processor to perform a plurality of operations comprising:
parsing a design file of an integrated circuit comprising a plurality of stages to extract a plurality of inputs and outputs of a plurality of latches;
sorting the latches based on latch locations in the stages;
building a plurality of ordered vectors of signals before and after the latches based on the sorting;
building a plurality of parity vectors for each of the ordered vectors of signals before and after the latches, the building of the parity vectors constrained based on a first parameter that defines a maximum number of bits per parity tree;
building a latch bank for each of the parity vectors before the latches;
building a parity vector comparison to detect a parity failure based on comparing the parity vectors after the latches with an output of the latch bank; and
updating the design file to fabricate the integrated circuit comprising the latches, the parity vectors, the latch bank, and the parity vector comparison.

16. The computer program product of claim 15, wherein the parsing is based on one or more patterns detected in the design file.

17. The computer program product of claim 16, wherein the one or more patterns comprise one or more of: an instantiation pattern, content of a netlist, clock buffer usage, and a naming convention applied to the inputs and outputs of the latches, wherein the naming convention identifies the stages.

18. The computer program product of claim 15, wherein the operations further comprise:
constraining generation of the parity vectors based on a second parameter that defines an amount of bits to be protected.

19. The computer program product of claim 15, wherein the parity vectors apply an exclusive-or logical function to a plurality of bits in the ordered vectors of signals, and the parity vector comparison is generated based on determining that the stages are active.

20. The computer program product of claim 15, wherein the operations further comprise:

initiating fabrication of the integrated circuit comprising the latches, the parity vectors, the latch bank, and the parity vector comparison.

* * * * *